United States Patent
Staffeld et al.

(10) Patent No.: US 11,084,714 B2
(45) Date of Patent: Aug. 10, 2021

(54) METHOD FOR SETTING A PRESSURE IN A CAVITY FORMED WITH THE AID OF A SUBSTRATE AND A SUBSTRATE CAP, AND SYSTEM

(71) Applicant: Robert Bosch GmbH, Stuttgart (DE)

(72) Inventors: Peter Borwin Staffeld, Stuttgart (DE); Achim Kronenberger, Reutlingen (DE); Rafel Ferre I Tomas, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/682,808

(22) Filed: Nov. 13, 2019

(65) Prior Publication Data

US 2020/0156931 A1    May 21, 2020

(30) Foreign Application Priority Data

Nov. 15, 2018  (DE) .......................... 102018219519.6

(51) Int. Cl.
*B81B 7/00* (2006.01)
*B81C 1/00* (2006.01)

(52) U.S. Cl.
CPC ........ *B81B 7/0041* (2013.01); *B81C 1/00293* (2013.01); *B81B 2201/0235* (2013.01); *B81B 2201/0242* (2013.01); *B81B 2203/0315* (2013.01); *B81C 2203/019* (2013.01)

(58) Field of Classification Search
CPC .... B81B 2201/0235; B81B 2201/0242; B81B 2203/0315; B81B 2203/019; B81B 7/0041; B81C 1/00293
See application file for complete search history.

(56) References Cited

U.S. PATENT DOCUMENTS

| | | | |
|---|---|---|---|
| 2006/0246631 A1* | 11/2006 | Lutz | B81C 1/0096 438/127 |
| 2016/0244325 A1* | 8/2016 | Cheng | B81B 7/02 |
| 2017/0073219 A1* | 3/2017 | Takagi | B81B 7/0051 |

FOREIGN PATENT DOCUMENTS

| DE | 102014202801 A1 | 8/2015 |
|---|---|---|
| DE | 102016218661 A1 | 3/2018 |

\* cited by examiner

*Primary Examiner* — Peniel M Gumedzoe
(74) *Attorney, Agent, or Firm* — Norton Rose Fulbright US LLP; Gerard Messina

(57) ABSTRACT

A method for setting a pressure in a cavity formed with the aid of a substrate and a substrate cap, a microelectromechanical system being situated in the cavity, the substrate including a main extension plane. The method includes the following steps: in a first step a clearance is created in the substrate cap, the clearance connecting the cavity to the surroundings, a first clearance end of the clearance being formed on a first surface of the substrate cap that faces away from the cavity, a second clearance end of the clearance being formed on a cavity-side second surface of the substrate cap, the first clearance end and the second clearance end being situated at a distance from one another at least in a first direction which is parallel to the main extension plane; in a second step, after the first step, the clearance is sealed.

12 Claims, 4 Drawing Sheets

METHOD FOR SETTING A PRESSURE IN A CAVITY FORMED WITH THE AID OF A SUBSTRATE AND A SUBSTRATE CAP, AND SYSTEM

CROSS REFERENCE

The present application claims the benefit under 35 U.S.C. § 119 of German Patent Application No. DE 102018219519.6 filed on Nov. 15, 2018, which is expressly incorporated herein in its entirety.

FIELD

The present invention relates to a method for setting a pressure in a cavity formed with the aid of a substrate and a substrate cap, a microelectromechanical system being situated in the cavity, the substrate including a main extension plane. The present invention also relates to a system, in particular a wafer system, including a cavity formed with the aid of a substrate and a substrate cap, a microelectromechanical system being situated in the cavity, the substrate including a main extension plane.

BACKGROUND INFORMATION

Different microelectromechanical systems (MEMS), in particular sensors, have different optimal operating pressures depending on the type or nature of the sensor. Methods exist by which a cavity internal pressure for the microelectromechanical system situated in the cavity may be adapted to the requirements thereof. One disadvantage of conventional methods is, however, that damage may often occur to the MEMS.

SUMMARY

It is an object of the present invention to provide a method for setting a pressure in a cavity formed with the aid of a substrate and a substrate cap, by use of which defects may be reduced or prevented.

An example method according to the present invention for setting a pressure in a cavity formed with the aid of a substrate and a substrate cap, according to the present invention, may have the advantage over the related art that the microelectromechanical element and also a wiring level situated in the substrate may advantageously be protected while the clearance (or the ventilation hole/slot) is being created and also while the clearance is being sealed.

By arranging the first and second clearance end at a distance from one another at least in a direction which is in parallel to a main extension plane of the substrate, according to the present invention it is possible to prevent a direct invasive influence of the resealing process on the core of the microelectromechanical system during the sealing of the clearance. In particular, due to the relative arrangement of the first and second clearance end, it is possible that a laser used for the sealing does not (directly) impact the functional layer of the MEMS and on the lower wiring level in the substrate, so that these may advantageously be protected against excessively high thermal heating. In addition, according to the present invention, it is advantageously possible, when creating the clearance (or the ventilation hole/slot), to avoid forming a slot which extends as far as the lower oxide and locally removes and damages the functional layer in which the MEMS is situated. Therefore, according to the present invention, defects in the finished component may be minimized in an efficient and cost-saving manner.

The fact that the first clearance end and the second clearance end are situated at a distance from one another at least in a first direction which is parallel to the main extension plane may in particular be understood according to the present invention to mean that at least a subarea of the first clearance end, preferably the entire (full-circumference) first clearance end, is situated at a distance or offset from at least a subarea of the second clearance end, preferably the entire (full-circumference) second clearance end, in a first direction which is parallel to the main extension plane.

According to the present invention, in the first step, the first clearance end and the second clearance end are formed at a distance from one another at least in a first direction which is parallel to the main extension plane. In addition, in the first step, the first clearance end and the second clearance end are typically formed at a distance from one another also in a second direction, which is perpendicular to the main extension plane. As a result, the first clearance end is situated offset from the second clearance end both in parallel to the main extension plane and perpendicular to the main extension plane. It is thus possible, for example, that a clearance which has a kink, for example, an L-shaped clearance, is created for ventilating the cavity.

Advantageous refinements and embodiments are described herein.

Since the cavity is hermetically sealed in the second step while a predefined ambient pressure prevails, it is advantageously possible according to one specific embodiment of the present invention to adapt the cavity internal pressure to the requirements of the microelectromechanical system. The internal pressure of the cavity after the sealing may in particular correspond to the ambient pressure (of the surroundings) in the second step.

Since the clearance is sealed in the second step with the aid of a laser beam, the laser beam impacting the clearance in particular at least essentially perpendicular to the main extension plane, it is possible according to one specific embodiment of the present invention that an efficient laser resealing process is used to seal the clearance. At the same time, negative effects of the laser on the sensor core and the wiring level may be prevented by the geometric shape of the clearance.

Since the clearance is formed in the first step in such a way that the laser beam does not directly enter the cavity in the second step, it is possible according to one specific embodiment of the present invention that an overheating of the sensitive areas of the microelectromechanical system is prevented.

Since, in a first substep of the first step, a first subarea of the clearance is formed at least essentially with an extension perpendicular to the main extension plane of the substrate, in particular with the aid of an at least partially anisotropic etching process, preferably with the aid of deep reactive ion etching, DRIE, a second subarea of the clearance being formed with the aid of an at least partially isotropic etching process in a second substep of the first step, which follows the first substep, it is possible according to one specific embodiment of the present invention to enable a particularly efficient formation of the geometrically advantageous clearance. The first subarea of the clearance may advantageously be created by a directional trenching process. The second subarea may in contrast be created by a non-directional etching process, so that a particularly advantageous lateral connection of the clearance to the cavity interior is made possible.

Since, in the first substep of the first step, the formation of the first subarea, in particular perpendicular to the main extension plane, is stopped with the aid of a stop layer, in particular an oxide stop layer, it is possible according to one specific embodiment of the present invention to ensure particularly efficient protection of the layers located below the stop layer and of the wiring level. The stop layer is particularly preferably already situated on the substrate-side surface of the substrate cap prior to the bonding of the substrate and substrate cap.

Since, in a pre-step prior to the first step, an indentation is formed on the second surface of the substrate cap, the second clearance end being formed in the first step at least partially on or with the aid of the indentation, it is possible according to one specific embodiment of the present invention that a particularly advantageous possibility is provided for (laterally) connecting the clearance to the cavity interior. As a result, a particularly large distance may be selected between the first clearance end (thus in particular the ventilation hole on the surface of the substrate cap that faces away from the cavity) and the cavity, and yet ventilation of the cavity is possible with the aid of the clearance.

Since the substrate has a further cavity, a further microelectromechanical system being situated in the further cavity, it is possible according to one specific embodiment of the present invention that different internal pressures may be set in the cavity and in the further cavity. Different microelectromechanical systems may thus be realized within a cramped space while ensuring the particular optimal operating pressure thereof. In particular, during the bonding of the substrate and substrate cap, the pressure may be set in such a way that the optimal operating pressure for the further microelectromechanical system is set in the further cavity.

Since the microelectromechanical system includes a rotation rate sensor, the further microelectromechanical system preferably including an acceleration sensor, it is possible according to one specific embodiment of the present invention that a rotation rate sensor and an acceleration sensor are provided within a cramped space in two physically separate atmospheres having a settable pressure. By way of example, during the bonding of the substrate and the substrate cap, the pressure may be set in such a way that an internal pressure which is optimal for the acceleration sensor is set in the further cavity for the acceleration sensor. With the aid of the first and second steps, an internal pressure which is optimal for the rotation rate sensor may then be set in the cavity for the rotation rate sensor.

According to the present invention, it is conceivable that one or multiple additional cavity(ies) is/are provided, in which in particular in each case at least one additional microelectromechanical system is provided. The additional microelectromechanical systems may be MEMS of various types. In a further first step and a further second step, clearances for ventilating the cavities and the seals of the clearances may be created, in particular in a manner analogous to the first and second step according to the present invention. Specific (and in particular different) internal pressures may thus be set in a plurality of cavities on a system, in particular a wafer system or chip.

It is possible for example that, in a further first step, a further clearance is created in the substrate cap, the further clearance connecting one of the additional cavities to the surroundings, a further first clearance end of the further clearance being formed on a first surface of the substrate cap that faces away from the additional cavity, a further second clearance end of the further clearance being formed on a second surface of the substrate cap that faces toward the additional cavity, the further first clearance end and the further second clearance end being situated at a distance from one another at least in a first direction which is parallel to the main extension plane. It is also possible that, in a further second step, after the further first step, the further clearance is sealed, in particular with the aid of a laser beam.

A further subject matter of the present invention is a system, in particular a wafer system, having a cavity formed with the aid of a substrate and a substrate cap, a microelectromechanical system being situated in the cavity, the substrate including a main extension plane, the substrate cap including a clearance which is created and sealed in particular with the aid of a method as recited in one of the preceding claims, and/or
   a first clearance end of the clearance being formed on a first surface of the substrate cap that faces away from the cavity, a second clearance end of the clearance being formed on a cavity-side second surface of the substrate cap, the first clearance end and the second clearance end being situated at a distance from one another at least in a first direction which is parallel to the main extension plane, the clearance being sealed.

The features, embodiments and advantages that have been described in connection with the method according to the present invention or in connection with a specific embodiment of the method according to the present invention may be used for the system according to the present invention.

Exemplary embodiments of the present invention are shown in the figures and are explained in greater detail below.

DETAILED DESCRIPTION OF EXAMPLE EMBODIMENTS

Figure 1:
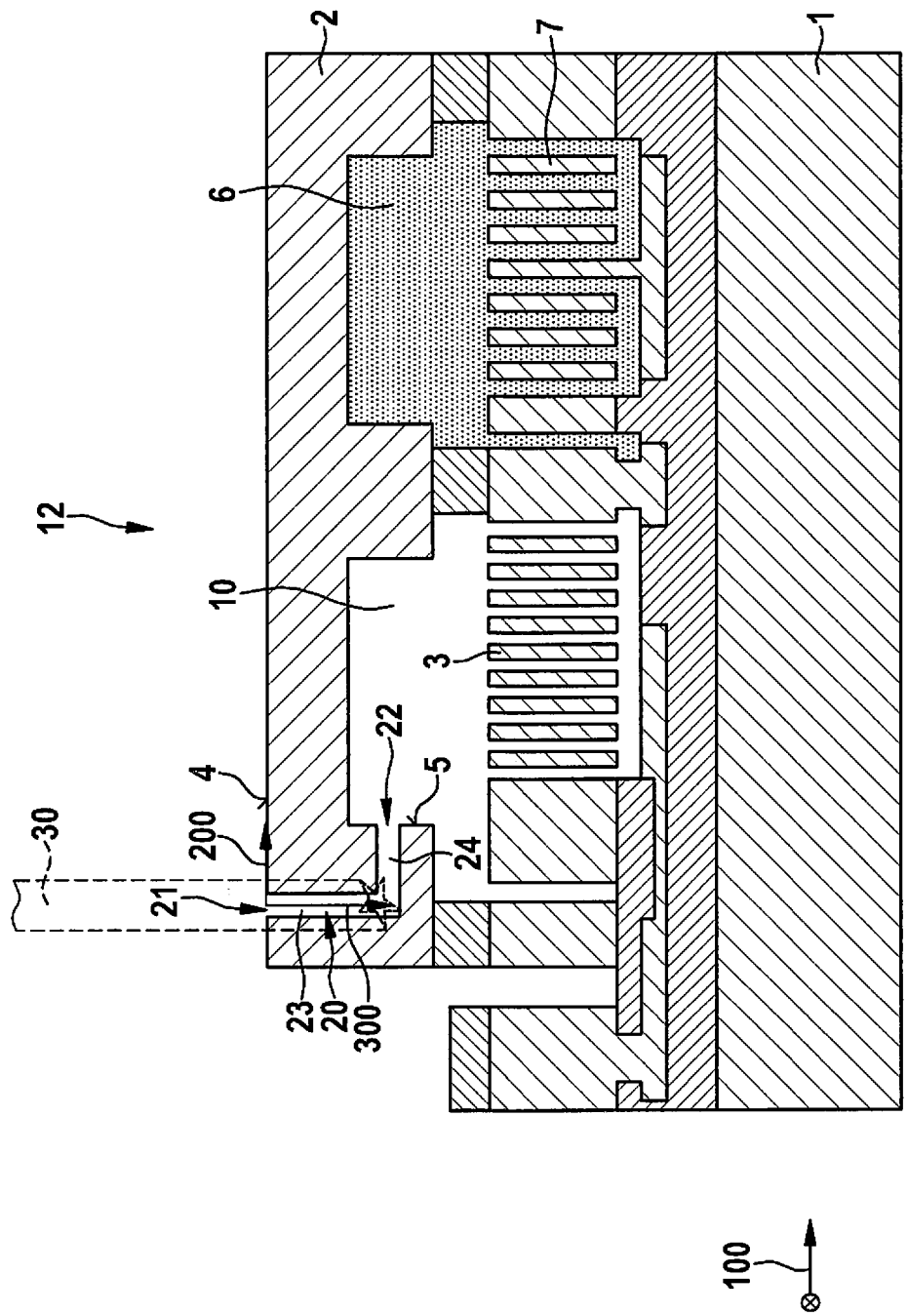
FIG. 1 shows a schematic illustration of a system, in particular of a wafer system, according to one specific embodiment of the present invention.

In the various figures, identical parts are provided with the same reference numerals and will therefore generally also be named or mentioned in each case only once.

FIG. 1 shows a schematic illustration of a system, in particular of a wafer system, according to one specific embodiment of the present invention. In particular, the second step of a method according to one specific embodiment of the present invention is shown.

The system includes a cavity 10 formed with the aid of a substrate 1 and a substrate cap 2 by bonding, and also a further cavity 6. The main extension direction 100 of substrate 1 is schematically shown. A microelectromechanical element 3, in particular a rotation rate sensor, is situated in cavity 10. A further microelectromechanical system 7, in particular an acceleration sensor, is located in further cavity 6.

The bonding process, during which the illustrated cavities 6 and 10 have been formed beforehand, has been carried out at a predefined ambient pressure, which corresponds to the operating pressure of the acceleration sensor. Since further cavity 6 has been hermetically sealed since the bonding and has not been ventilated again, the ideal operating pressure for the acceleration sensor thus prevails in further cavity 6. In contrast, for cavity 10, a clearance 20 has been created in substrate cap 2 in a first step. Clearance 20 connects the interior of cavity 10 to surroundings 12, so that cavity 10 is ventilated. A first clearance end 21 of clearance 20 is formed on a first surface 4 of substrate cap 2 that faces away from the cavity. A second clearance end 22 of clearance 20 is located on a cavity-side second surface 5 of substrate cap 2. First clearance end 21 and second clearance end 22 are situated at a distance from one another both in a first direction 200, which is parallel to main extension plane 100, and also in a second direction 300 (illustrated by arrow 300), which is perpendicular to main extension plane 100. Starting from clearance end 21, a first subarea 23 of clearance 20 extends at least essentially perpendicular to main extension plane 100. Clearance 20 also includes a second subarea 24, which opens into the cavity interior at second clearance end 22.

In a second step, after the first step, clearance 20 (or the ventilation hole or the ventilation slot) is then sealed with the aid of a laser beam 30, in particular at an ambient pressure that corresponds to the ideal operating pressure of the rotation rate sensor. Due to the geometric shape of clearance 20, laser beam 30 advantageously does not enter cavity 10 unhindered or directly, but rather impacts the material of substrate cap 2 at the transition from first subarea 23 to second subarea 24. The functional layer of microelectromechanical element 3 is thus not exposed to direct contact with laser beam 30, so that less thermal energy or no thermal energy is transferred. The core of microelectromechanical element 3 may thus advantageously be protected against invasive or damaging influences.

Figure 2:
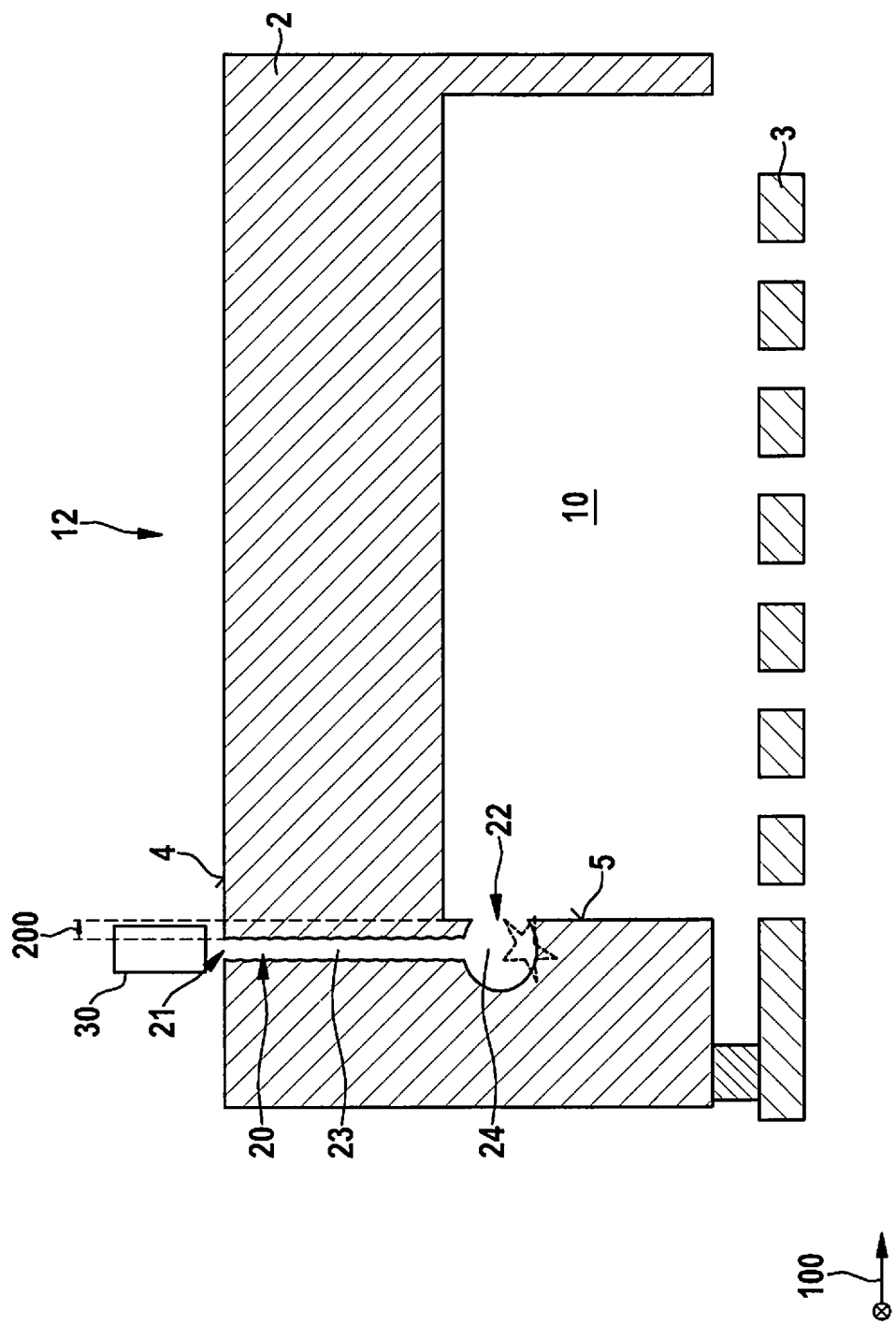
FIG. 2 shows a schematic illustration of a system, in particular of a wafer system, according to a first exemplary embodiment of the present invention.

FIG. 2 shows a schematic illustration of a system, in particular of a wafer system, according to a first exemplary specific embodiment of the present invention. In particular, only cavity 10 and its surroundings are shown. Further cavity 6, as described in FIG. 1, is not shown but may also be present, including the features thereof as described in the course of FIG. 1.

In the first exemplary specific embodiment, a first subarea 23 of clearance 20 extends at least essentially perpendicular to main extension plane 100. First subarea 23 has been produced in a first substep of the first step with the aid of an at least partially anisotropic etching process, preferably by deep reactive ion etching, DRIE. Clearance 20 also includes a second subarea 24, which opens into cavity 10 at second clearance end 22 on the cavity side. Second subarea 24 has been formed in particular in a second substep of the first step with the aid of an at least partially isotropic etching process. Lateral contact of clearance 20 with the interior of cavity 10 is thus formed with the aid of second subarea 24. The two vertical dashed lines, between which arrow 200 is shown, illustrate the offset or distance of first clearance end 21 from second clearance end 22 in first direction 200, which is parallel to main extension plane 100.

When clearance 20 is being sealed in a second step, a laser beam 30 cannot enter cavity 10 unhindered or directly due to the geometric shape of clearance 20, but rather impacts the material of substrate cap 2 in second subarea 24 of clearance 20. The functional layer of microelectromechanical element 3 is thus not exposed to direct contact with laser beam 30. In addition, it is advantageous that an etching into the functional layer during the anisotropic etching in the first substep of the first step is prevented due to the geometric shape of clearance 20, which may advantageously lead to a reduction in defects in the finished component.

Figure 3:
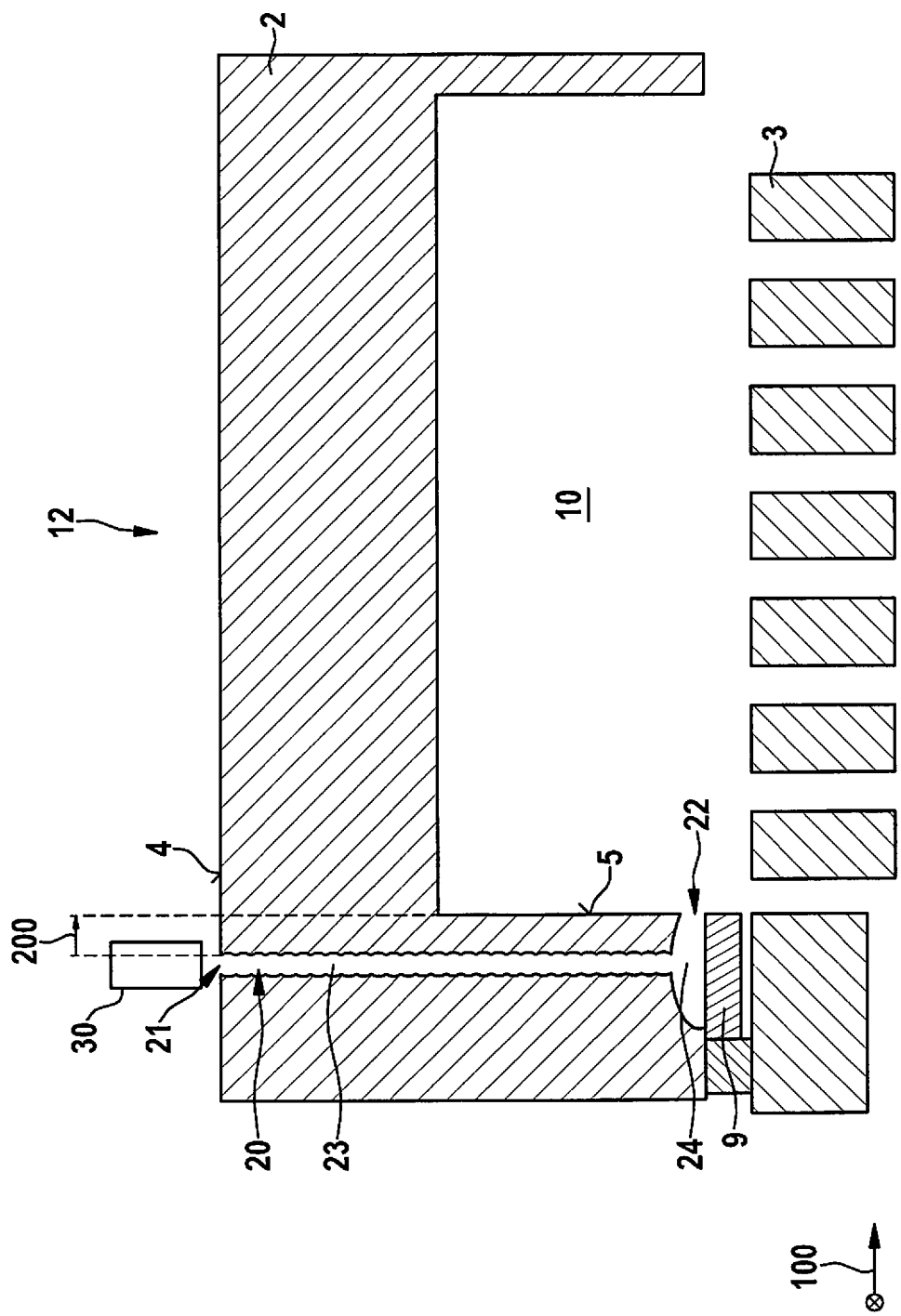
FIG. 3 shows a schematic illustration of a system, in particular of a wafer system, according to a second exemplary embodiment of the present invention.

FIG. 3 shows a schematic illustration of a system, in particular of a wafer system, according to a second exemplary specific embodiment of the present invention. The second exemplary specific embodiment is similar to the first exemplary specific embodiment shown in FIG. 2. In contrast to the first exemplary specific embodiment, in the second exemplary specific embodiment a stop layer 9 is additionally situated at least below first subarea 23 of clearance 20. Stop layer 9 is situated in particular on the substrate-side surface of substrate cap 2 and is thus located between substrate 1 and substrate cap 2 after bonding. In the first substep of the first step, the formation of first subarea 23, in particular perpendicular to main extension plane 100, may be stopped by stop layer 9. An etching into or through the functional layer of microelectromechanical element 3 in the first step may thus particularly advantageously be prevented.

Figure 4:
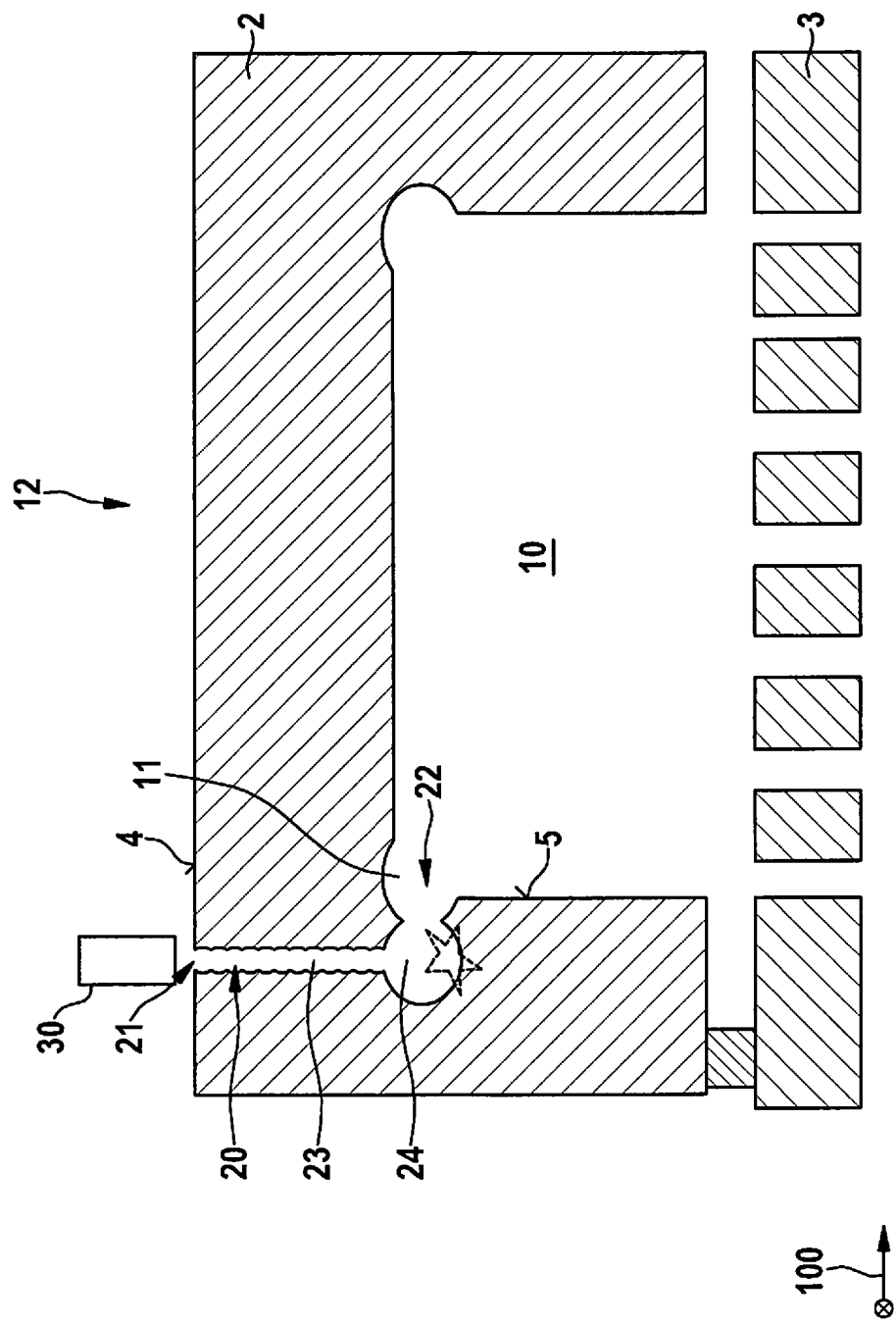
FIG. 4 shows a schematic illustration of a system, in particular of a wafer system, according to a third exemplary embodiment of the present invention.

FIG. 4 shows a schematic illustration of a system, in particular of a wafer system, according to a third specific exemplary embodiment of the present invention. The third exemplary specific embodiment is similar to the first exemplary specific embodiment shown in FIG. 2. In contrast to the first exemplary specific embodiment, in the third exemplary embodiment an indentation 11 has additionally been formed on second surface 5 of substrate cap 2 in a pre-step prior to the first step (and in particular prior to the bonding of substrate 1 and substrate cap 2). This additional indentation 11 makes it possible to achieve an advantageous formation of clearance 20 in the first step. Second subarea 24 of clearance 20 may be created directly adjoining indentation 11. Advantageously, therefore, on the one hand the distance between cavity 10 and first subarea 23 of clearance 20 may be increased and on the other hand the isotropic etching in the second substep of the first step (thus the formation of second subarea 24) may be reduced.

What is claimed is:

1. A method for setting a pressure in a cavity formed using a substrate and a substrate cap, a microelectromechanical system being situated in the cavity, the substrate including a main extension plane, the method comprising the following steps:
   in a first step, creating a clearance in the substrate cap, the clearance connecting the cavity to a surroundings of the substrate cap, a first clearance end of the clearance being formed on a first surface of the substrate cap that faces away from the cavity, a second clearance end of the clearance being formed on a cavity-side second surface of the substrate cap, the first clearance end and the second clearance end being situated at a distance from one another at least in a first direction, the first direction being parallel to the main extension plane; and
   in a second step, after the first step, sealing the clearance, wherein, in a first substep of the first step, a first subarea of the clearance is formed with an extension perpendicular to the main extension plane of the substrate, and a second subarea of the clearance is formed such that it opens into the cavity at the second clearance end in a second substep of the first step, which follows the first substep.

2. The method as recited in claim 1, wherein the cavity is hermetically sealed in the second step while a predefined ambient pressure prevails.

3. The method as recited in claim 1, wherein the clearance is sealed in the second step by a laser beam, the laser beam impacting the clearance perpendicular to the main extension plane.

4. The method as recited in claim 3, wherein the clearance is formed in the first step in such a way that the laser beam does not directly enter the cavity in the second step.

5. The method as recited in claim 1, further comprising:
forming a further cavity, a further microelectromechanical system being situated in the further cavity.

6. The method as recited in claim 5, wherein the microelectromechanical system includes a rotation rate sensor, the further microelectromechanical system includes an acceleration sensor.

7. A method for setting a pressure in a cavity formed using a substrate and a substrate cap, a microelectromechanical system being situated in the cavity, the substrate including a main extension plane, the method comprising the following steps:
in a first step, creating a clearance in the substrate cap, the clearance connecting the cavity to a surroundings of the substrate cap, a first clearance end of the clearance being formed on a first surface of the substrate cap that faces away from the cavity, a second clearance end of the clearance being formed on a cavity-side second surface of the substrate cap, the first clearance end and the second clearance end being situated at a distance from one another at least in a first direction, the first direction being parallel to the main extension plane; and
in a second step, after the first step, sealing the clearance,
wherein, in a first substep of the first step, a first subarea of the clearance is formed with an extension perpendicular to the main extension plane of the substrate, using an at least partially anisotropic etching process, a second subarea of the clearance being formed with using an at least partially isotropic etching process in a second substep of the first step, which follows the first sub step.

8. The method as recited in claim 7, wherein in the first sub step of the first step, the first subarea of the clearance is formed using deep reactive ion etching (DRIE).

9. The method as recited in claim 7, wherein, in the first substep of the first step, the formation of the first subarea perpendicular to the main extension plane is stopped using a stop layer.

10. The method as recited in claim 9, wherein the stop later is an oxide stop layer.

11. A method for setting a pressure in a cavity formed using a substrate and a substrate cap, a microelectromechanical system being situated in the cavity, the substrate including a main extension plane, the method comprising the following steps:
in a first step, creating a clearance in the substrate cap, the clearance connecting the cavity to a surroundings of the substrate cap, a first clearance end of the clearance being formed on a first surface of the substrate cap that faces away from the cavity, a second clearance end of the clearance being formed on a cavity-side second surface of the substrate cap, the first clearance end and the second clearance end being situated at a distance from one another at least in a first direction, the first direction being parallel to the main extension plane; and
in a second step, after the first step, sealing the clearance,
wherein, in a pre-step prior to the first step, an indentation is formed on the second surface of the substrate cap, the second clearance end being formed in the first step at least partially on or using the indentation.

12. A wafer system, comprising:
a substrate and a substrate cap, a cavity being formed using the substrate and the substrate cap, the substrate including a main extension plane;
a microelectromechanical system situated in the cavity; and
an indentation,
wherein the substrate cap includes a clearance, a first clearance end of the clearance being formed on a first surface of the substrate cap that faces away from the cavity, a second clearance end of the clearance being formed on a cavity-side second surface of the substrate cap, the first clearance end and the second clearance end being situated at a distance from one another at least in a first direction, the first direction being parallel to the main extension plane, and the clearance being sealed,
wherein a first subarea of the clearance is formed with an extension perpendicular to the main extension plane of the substrate, and a second subarea of the clearance is formed such that it opens into the cavity at the second clearance end,
wherein the indentation is formed on the second surface of the substrate cap, and the second subarea of the clearance directly adjoins the indentation.

* * * * *